United States Patent [19]

Herleikson

[11] Patent Number: 4,853,643

[45] Date of Patent: Aug. 1, 1989

[54] HIGH SIGNAL TO NOISE RATIO AMPLITUDE DETECTOR

[75] Inventor: Earl C. Herleikson, Otis Orchards, Wash.

[73] Assignee: Hewlett-Packard Company, Palo Alto, Calif.

[21] Appl. No.: 263,142

[22] Filed: Oct. 26, 1988

[51] Int. Cl.$^4$ ............................................... H03D 1/10
[52] U.S. Cl. .................................................... 329/204
[58] Field of Search ................ 331/109, 135, 166, 204

[56] References Cited

U.S. PATENT DOCUMENTS 4,229,735  10/1980  Houck ............................ 329/204 X Primary Examiner—David Mis
Attorney, Agent, or Firm—Leslie G. Murray

[57] ABSTRACT

A low noise floor amplitude detector circuit utilizes a pair of semiconductor diodes connected between a radio frequency signal source and a terminating device that biases the diode at a conduction angle selected for maximum signal to noise ratio in the detector circuit. Optimum bias conditions and a low signal to noise ratio is achieved by using a conduction angle at each diode of 1.656 radians (approximately 67 degrees). This also results in matching of the radio frequency load impedance of the amplitude detector to the radio frequency impedance of a signal source.

10 Claims, 6 Drawing Sheets $$R_{in} = \frac{dV_{out}}{dI_{dc}} = e\frac{(R_s + R_d)\pi}{\cos^{-1}\left(\frac{\frac{V_{out}}{2} + V_d}{V_p}\right)}$$

$$\left.\frac{dI_{dc}}{dV_p}\right|_{V_{out}=CONSTANT} = e\frac{\sin\left(\cos^{-1}\left(\frac{\frac{V_{out}}{2} + V_d}{V_p}\right)\right)}{R_{in}\cos^{-1}\left(\frac{\frac{V_{out}}{2} + V_d}{V_p}\right)}$$

$$\left.\frac{dV_{out}}{dV_p}\right|_{I_{dc}=CONSTANT} = e\frac{\sin\left(\cos^{-1}\left(\frac{\frac{V_{out}}{2} + V_d}{V_p}\right)\right)}{\cos^{-1}\left(\frac{\frac{V_{out}}{2} + V_d}{V_p}\right)}$$

LET $\cos^{-1}\left(\dfrac{\frac{V_{out}}{2} + V_d}{V_p}\right) = \theta$

MAXIMUM SNR WHEN $\dfrac{\frac{dV_{out}}{dV_p}}{\sqrt{R}}$ = MAXIMUM $$\frac{d}{d\theta}\left(\frac{\frac{dV_{out}}{dV_p}}{\sqrt{R}}\right) = \frac{-\frac{1}{2}\sin\theta + \theta^2 \cos\theta}{\theta^{3/2}} = 0$$

$\theta = 1.165$ rad $(67°)$ FOR MAXIMUM SNR

FIG. 15

HIGH SIGNAL TO NOISE RATIO AMPLITUDE DETECTOR

DESCRIPTION

1. Technical Field

This disclosure relates to solid state amplitude detectors used in instrumentation for demodulation and measurement of radio frequency signals.

2. Background Art

Amplitude detectors are used in electronic instrumentation to measure the amplitude of low frequency signals and noise present in radio frequency (RF) signals.

Peak detectors, utilizing semiconductor diodes for measuring the maximum amplitude of a radio frequency signal provided from a signal source, typically connect the signal source to one side of a semiconductor diode, the remaining side of the diode being an output that is connected to ground through a capacitor. Forward current through the diode charges the capacitor to the signal voltage level of the source. A basic wiring diagram of a prior art peak detector is shown in FIG. 1, where the reference numeral 10 designates a radio frequency signal source, the reference numeral 11 designates a semiconductor diode, reference numeral 12 designates the capacitor, and reference numeral 13 designates the output of the circuit.

DISCLOSURE OF INVENTION

This invention is a low noise floor amplitude detector. The detector consists of a detector diode, a capacitor and a means for setting the bias point of the diode for maximum signal to noise ratio (SNR). The detector diode permits only unidirectional charge flow which occurs when the anode voltage becomes greater than the cathode voltage. The capacitor stores the pulses of charge from the detector diode, averaging the charge flow over many cycles of the RF waveform. The amount of time during an RF cycle that the detector is forward biased is determined by the means for setting bias. This means could be a current source with the output measured as a voltage, a voltage source with the output measured as a current, an active load or a passive load. The time that the diode is forward biased will determine the source noise, the detector gain and hence the signal to noise ratio of the AM detector.

The amount of time that the diode is forward biased and charge is flowing can be described by the conduction angle. If the RF source is described by a cosine wave, then the voltage is maximum at zero radians. For the case where the anode of the diode is connected to RF source, the diode is forward biased when the voltage is maximum. The conduction angle is the angle at which the diode stops conducting. Dividing the conduction angle by PI radians will give the percent time that the diode is forward biased during one cycle of the RF waveform. The conduction angle is determined by the low frequency bias conditions.

The source impedance of the amplitude detector at low frequencies can be determined by either changing the voltage and measuring the current change or changing the current and measuring the voltage change. Dividing the RF source impedance by the fraction of one cycle that the diode is conducting (conduction angle divided by PI) gives the low frequency source impedance of the detector. This source impedance will determine the source noise of the detector. If the conduction angle is small, the voltage at the detector output will be large; but so will the source impedance and the source noise. In fact the source impedance increases much faster than the detected voltage—decreasing the Signal to Noise Ratio. If the conduction angle is too large, the detector voltage will approach zero and the detector source impedance will approach twice the RF source impedance. For this case the detected voltage decreases much faster than the source impedance $\theta$ decreasing the SNR. Writing an equation for the SNR of the detector and solving it for the maximum SNR will give the conduction angle for lowest noise operation.

Once the optimum conduction angle for lowest noise operation has been determined, the low frequency source impedance to operate a diode over that angle can be calculated. The optimum bias conditions will exist when a resistor of value equal to the source impedance of the detector is placed at the output of the detector. Using a resistor or passive resistance to set the bias conditions will allow bias to be correctly set for changing levels of the RF signal. This, however, will degrade the SNR by 3 dB over the current source and the voltage source methods of setting bias because of the additive resistor noise. Using an active resistive load has the advantages of the passive load without the additional noise.

Real world diodes have a turn on voltage and a dynamic on resistance. The turn on voltage can be accounted for by using a ground reference that is offset by the turn on voltage of the diode. The dynamic on resistance will add to the source noise of the RF source, and must be accounted for in the calculation of the detector source impedance. It is important to choose a diode with a low dynamic on resistance, because the SNR of the detector is degraded by the added source resistance noise.

The improved SNR of the amplitude detector is achieved by duplicating the detector for detection of both halves of each RF waveform. By parallel operation of two of the detectors, the signal level is doubled. The source resistance will also double, but resistor noise will only increase by the square root of resistance. Therefore, the SNR of the detector is three dB better.

The present invention arose as a result of design efforts relating to electronic instrumentation which required reduction in the noise floor of such detector circuits. The goal of this effort was to design an amplitude detector with a maximum signal to noise ratio (SNR) and efficient impedance.

The main advantage of this circuit design is its ability to measure the low frequency amplitude fluctuations of radio frequency signals with a high SNR. The average RF load impedance that the detector presents to the RF source has been found to be approximately equal to the source RF impedance, and therefore properly terminates the RF signal with a low standing wave ratio (SWR).

Another unique advantage of this detector is that it has a differential output capability, which results in better rejection to effects like 60 Hz power line pickup from ground loops or magnetic radiation.

BRIEF DESCRIPTION OF DRAWINGS

FIG. 6 is a summarized listing of the mathematical relationships by which the diode conduction angle for maximum SNR was calculated;

BEST MODES FOR CARRYING OUT THE INVENTION

Figure 1:
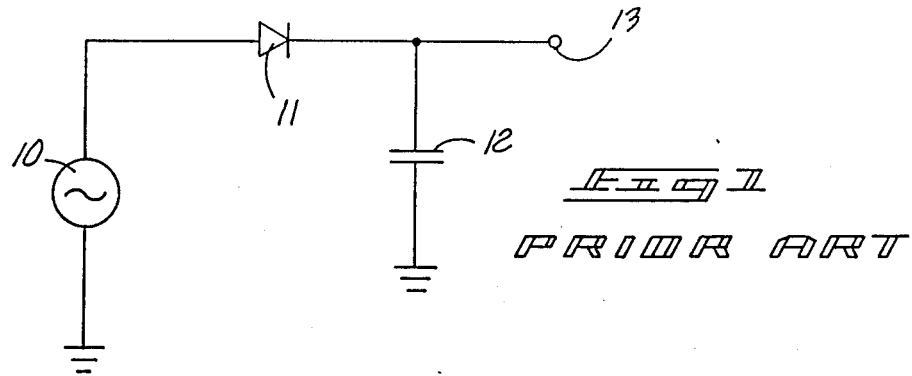
FIG. 1 is a prior art simplified wiring diagram for a peak detector.
Figure 2:
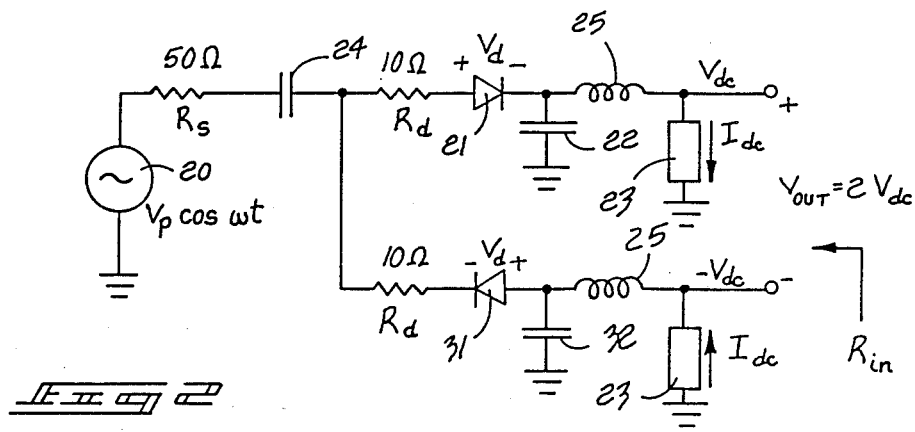
FIG. 2 is a schematic diagram illustrating the general circuit components of an amplitude detector constructed according to this disclosure.

FIG. 2 generally illustrates the components and circuit equivalents included within the amplitude detector. A pair of semi-conductor diodes 21, 31 are oriented oppositely to one another within parallel circuits adapted to be operatively connected to a radio frequency (RF) signal source 20. A first capacitor 22 is operatively connected between one side of the first diode 21 and the ground. A second capacitor 32 is operatively connected between one side of the second diode 31 and ground.

Figure 3:
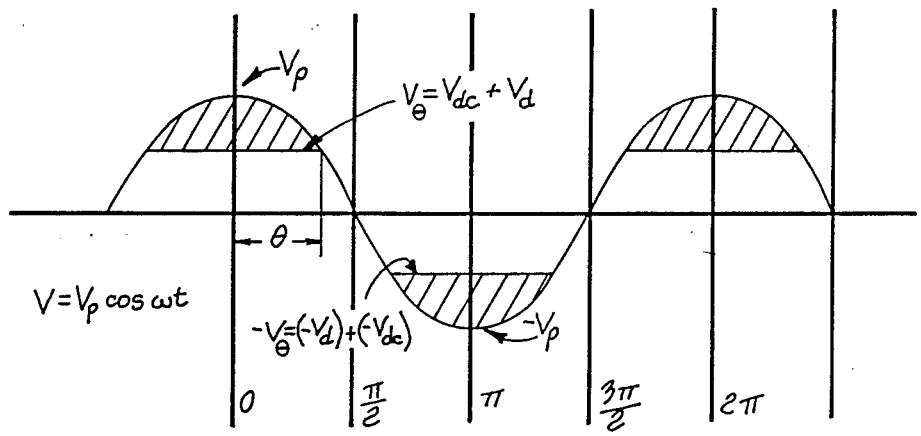
FIG. 3 is a graph of output voltage as a function of radians.

The amplitude detector is completed by terminating means 23 connected across the parallel circuits for properly biasing each diode to cause it to conduct current from the signal source 20 at a conduction angle $\theta$, which is graphically illustrated in FIG. 3. The conduction angle is selected to minimize the Signal to Noise Ratio (SNR) of the amplitude detector. It also matches the radio frequency load impedance of the amplitude detector to the radio frequency impedance of the signal source 20. The signal terminating means 23 has an output at which a demodulated signal is produced having an amplitude proportional to the amplitude of any low frequency signal present in a radio frequency signal directed to the amplitude detector from the signal source 20.

Referring further to FIG. 2, the waveform of a typical RF signal having a sinusoidal shape, can be expressed by the formula $V_p \cos \omega t$, where $V_p$ is the peak voltage amplitude of the incoming RF signal. $R_s$ denotes the RF impedance of signal source 20, which is conventionally 50 ohms. Capacitor 24, shown to be in series between signal source 20 and the two parallel diode circuits, provides a "floating" input signal relative to ground. The inclusion of capacitor 24 in conjunction with capacitors 22 and 32 is a circuit design alternative that is described below. $R_d$ is a circuit equivalent for the typical dynamic on resistance of each diode 21, 31. For illustration, $R_d$ is quantified as 10 ohms. The inductor 25 provides RF filtering of the low frequency signal prior to the signal terminating means 23. Signal terminating means 23 is illustrated as two separate devices leading from each parallel circuit to ground. The current flowing through each device is designated as $I_{dc}$. The voltage level at the connection between the signal terminating means 23 and each parallel circuit is designated as $V_{dc}$. The output voltage across the terminal ends of the parallel circuits is designated as $V_{out}$ and is equal to $2V_{dc}$.

FIG. 3 graphically illustrates the angular relationships between voltage and current (indicated by the shaded lines within the sinusoidal curve) for a selected diode conduction angle $\theta$. The calculation of $\theta$ and the low frequency source impedance of the amplitude detector ($R_{in}$) is presented in FIG. 6. It can be seen that when these mathematical relationships are solved to determine the maximum Signal to Noise Ratio, $\theta$ equals 1.165 radians or approximately 67°. This means that each diode 21, 22 conducts over a total angle of 134° during each half cycle of the incoming radio frequency waves or during 37% of each full cycle. Once the optimum conduction angle for lowest noise operation is determined, one can calculate the low frequency source impedance of the amplitude detector required to achieve optimal operation. Based on a conduction angle of 1.1656 radians, the amplitude detector source impedance is 2.695 times the impedance of the RF source impedance, which in turn is the sum of the impedance of source 20 plus the impedance of each diode 21, 31 ($R_s$ plus $R_d$).

It was further demonstrated experimentally that the average RF load impedance that the amplitude detector presents to the RF source 20 is approximately equal to the source impedance of the RF source. This properly matches the radio frequency load impedance of the detector to the radio frequency impedance of the signal source for efficient termination of the RF signal.

Figure 4:
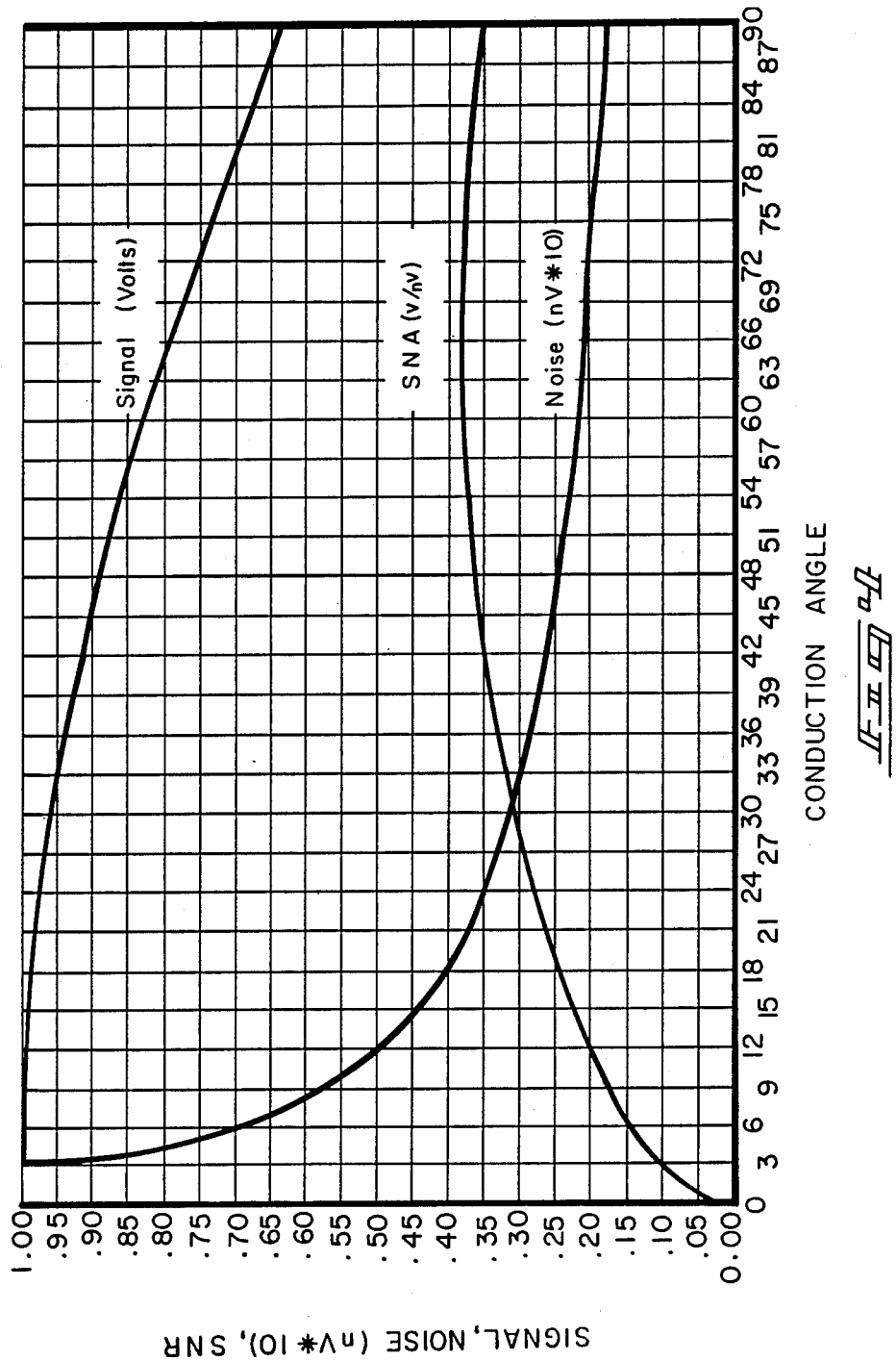
FIG. 4 is a plot of SNR, noise and signal amplitude as a function of diode conduction angle.
Figure 5:
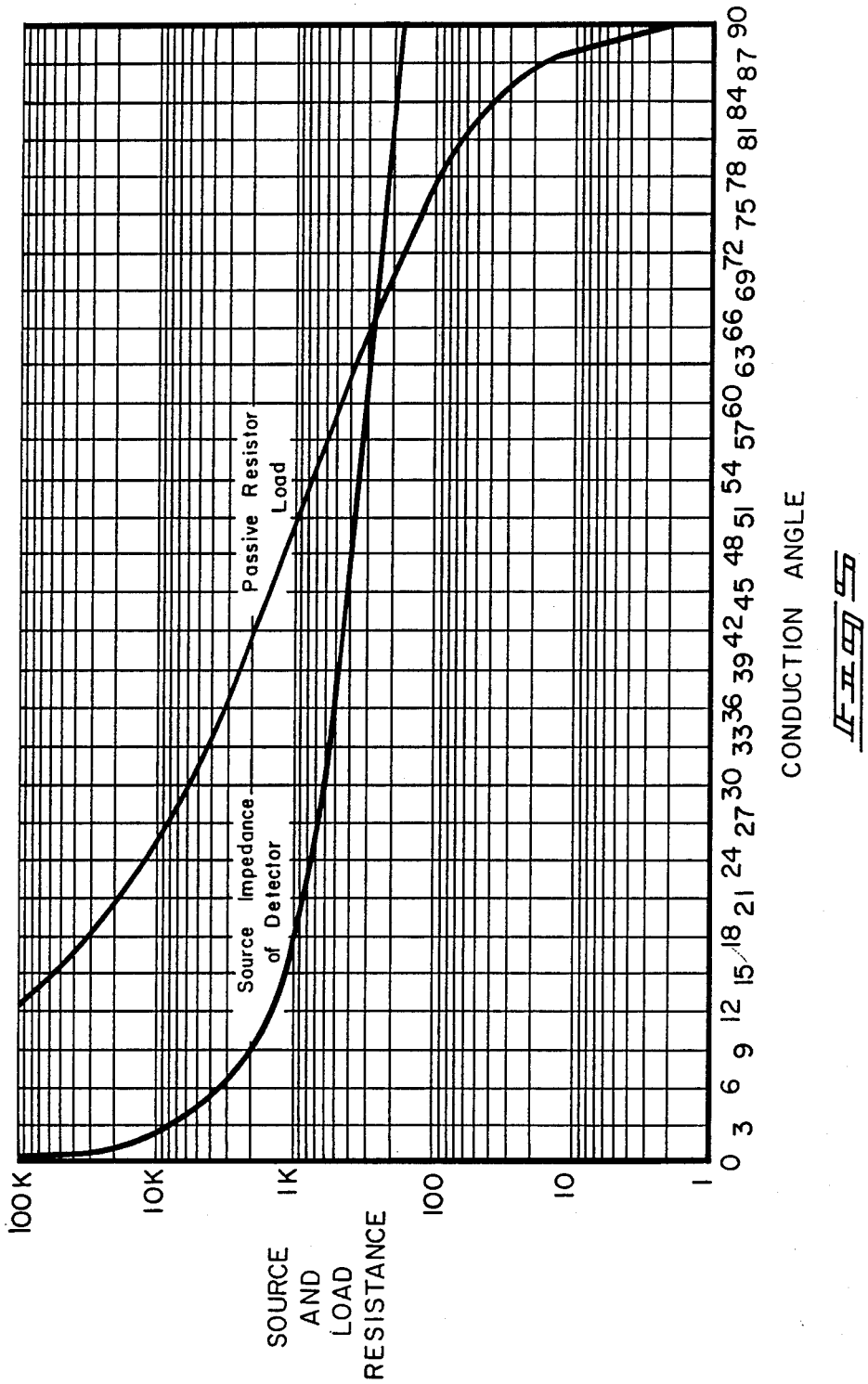
FIG. 5 is a plot of diode conduction angle as a function of the source impedance and load resistance (on a logarithmic scale)

FIGS. 4 and 5 are plots of theoretically derived data relating to the Signal to Noise Ratio as a function of diode conduction angle (FIG. 4) and the conduction angle as a function of the dynamic source impedance of the detector, as well as a passive resistor load utilized as the signal terminating means 23. They graphically illustrate the optimum Signal to Noise Ratio and load matching that occur at a conduction angle of 67°.

Figure 8:
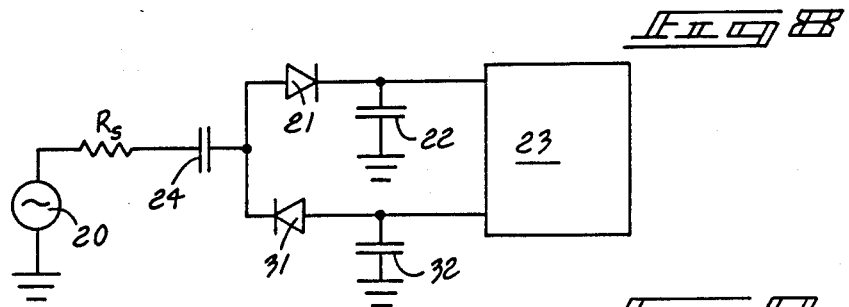
FIGS. 8–10 generally illustrate these variations of the amplitude detector circuitry.
Figure 9:
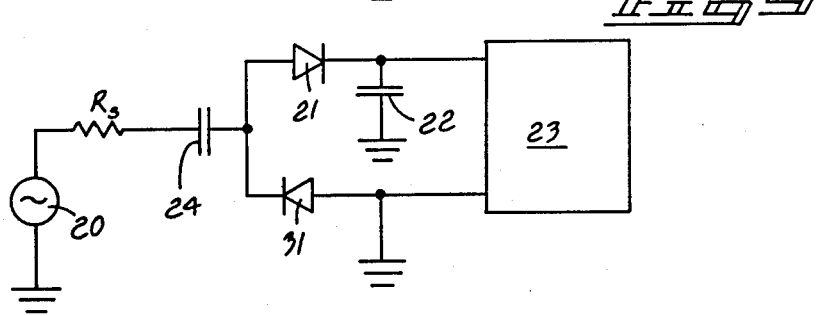
Figure 10:
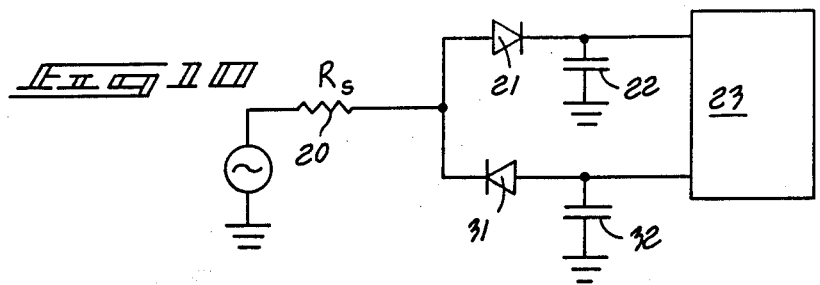

FIGS. 8–10 schematically illustrate variations in circuit design that incorporate the operational features described above. In FIG. 8, three capacitors are used, the third capacitor 24 providing a "floating" RF signal input to the parallel circuits that include diodes 21, 31. In FIG. 9, only two capacitors are used. One diode 31 has one side shorted directly to ground and its remaining side is connected to ground through the floating connection provided by capacitor 24 and the signal source 20. It is to be understood that either diode 21 or 31 can have one side directly shorted to ground in this manner. FIG. 10 shows the use of both capacitors 22, 32 as previously described, with one side of diode 31 shunted to ground directly through the RF signal source 20.

Figure 11:
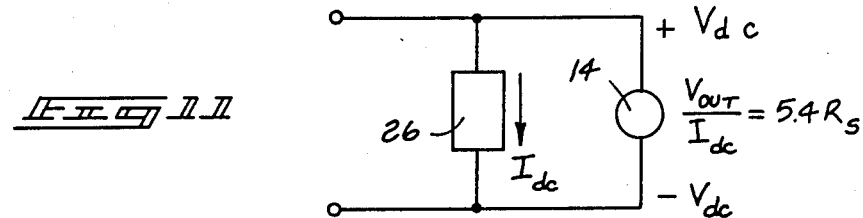
FIGS. 11–14 schematically illustrate four types of terminations usable in the amplitude detector.
Figure 12:
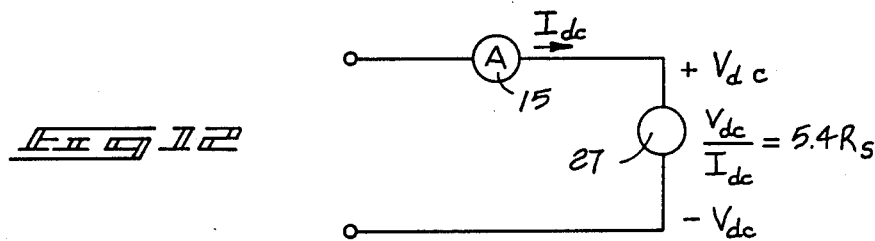

FIGS. 11 through 14 schematically illustrate the various types of devices that can be used as the terminating means 23 in the amplitude detector. FIGS. 11 and 12 numerically indicate the low frequency impedance value of the terminating means 23 required to achieve the selected diode conduction angle of 67°. It is stated as a function of the signal source impedance $R_s$.

In FIG. 11, the terminating means is shown as a constant current source 26, the output, ($V_{out}$), being the voltage across the current source 26. The output voltage may be measured by a conventional voltage meter 14 connected across the current source 26.

In FIG. 12, the signal terminating means is a constant voltage source 27 and the output of the amplitude detector ($I_{out}$) is readable as the current flowing through voltage source 27. The output current signal may be measured by a conventional current meter 15 in series with the voltage source 27.

Figure 13:
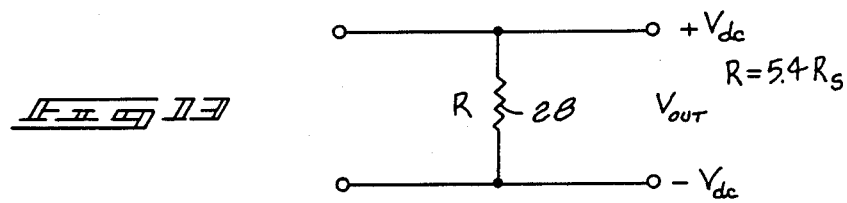
Figure 14:
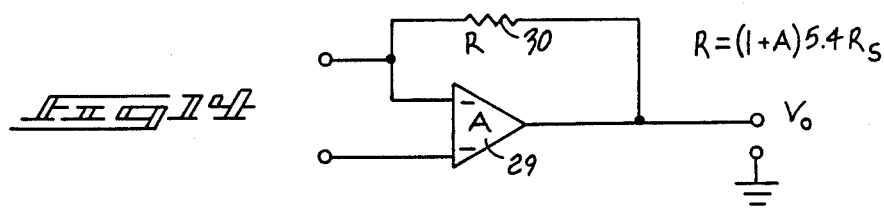

In FIG. 13, the signal terminating means is a passive resistive load or resistor 28 and the output ($V_{out}$) is readable as the voltage across resistor 28. In FIG. 14 the signal terminating means is an active resistive load comprising amplifier 29 and feedback resistor 30 where the value of resistor 30 is given by the equation shown and provides an equivalent impedance equal to that shown in FIG. 13. The output is readable as changes in the voltage output ($V_{out}$) at the output terminals of amplifier 29.

Figure 7:
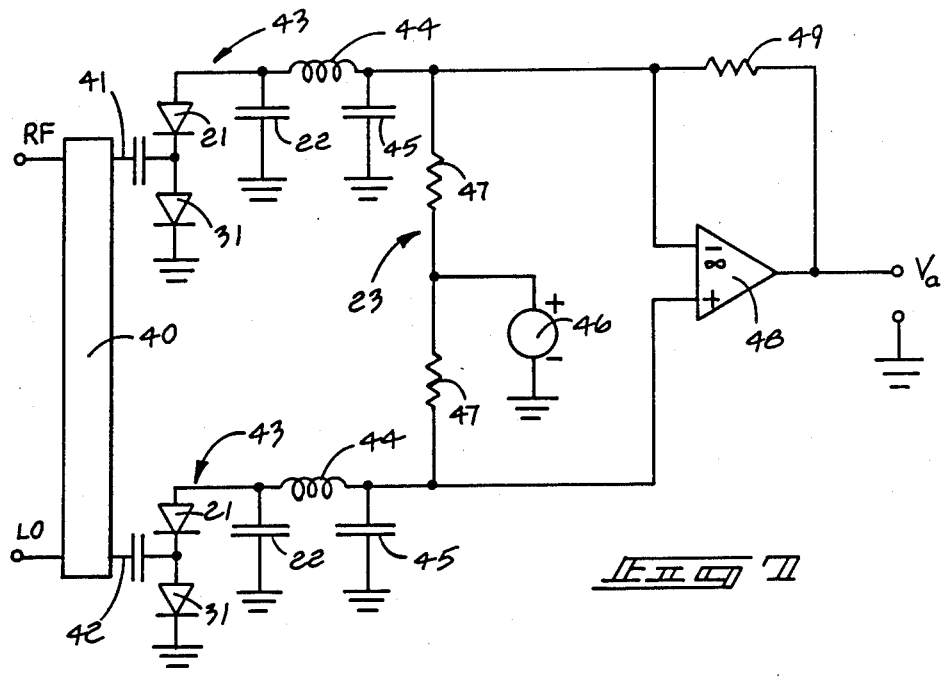
FIG. 7 is a simplified wiring diagram of the present best mode for carrying out this invention.

The best mode of utilizing the amplitude detector at the present time applies to its inclusion within a phase detector designed for measuring radio frequency noise. A simplified circuit diagram of the current phase detector circuitry is shown in FIG. 7. In accord with conventional notation, two incoming radio frequency signals are fed to the radio frequency (RF) and local oscillator (LO) signal inputs of a combining means 40 having separate signal outputs 41 and 42. Signal outputs 41 and 42 serve as both through ports and coupled ports for the incoming radio frequency signals at the signal inputs. The phase angle of at least one of the incoming signals is shifted by a constant angular amount between the two signal outputs 41 and 42. While the combining means 40 might be a transformer, it is preferably a transmission line coupler, such as a length of coaxial cable having a pair of twisted interior conductors insulated from one another and surrounded by a cylindrical shield.

Each signal output 41, 42 is fed to an amplitude detector 43 of the type described above. In the illustrated circuit, the two diodes 21, 31, which are included within parallel circuits leading to the signal outputs 41, 42, are connected with one side of diode 21 shunted to ground through capacitor 22 and one side of diode 31 shunted to ground through a through port connection leading from combining means 40. Filtering of RF wave forms is assured through provision of a filter comprised of an inductor 44 and capacitor 45.

The signal terminating means 23 is shown in FIG. 7 as passive resistors 47. A constant voltage source 46 in series with each resistor 47 provides the turn on voltage for the diodes of the amplitude detectors. The output signals from the two amplitude detectors are directed to a summation means that produces a signal that is a function of any difference in the amplitudes of the demodulated signals produced by the amplitude detectors 43. The illustrated summation means is an operational amplifier 48 and a resistor 49 that provides negative feedback. Any differences in the output voltage amplitudes at the amplitude detectors 43 will be reflected as a change in voltage ($V_a$) at the output of operational amplifier 48.

The invention has been described in language more or less specific as to physical features of the described circuits. It is to be understood, however, that the invention is not limited to the specific features shown, since the means and construction herein disclosed comprise a preferred form of putting the invention into effect. The invention is, therefore, claimed in any of its forms or modifications within the proper interpretation of the appended claims.

I claim:

1. A low noise floor amplitude detector for a radio frequency signal, comprising:
   a pair of semiconductor diodes oriented oppositely to one another within parallel circuits adapted to be operatively connected to a radio frequency source;
   a first capacitor operably connected between one side of one diode and ground;
   a second capacitor operably connected between one side of the remaining diode and ground; and
   terminating means connected across the parallel circuits for biasing each diode at a predetermined conduction angle causing each diode to conduct in sequence during a predetermined percent of each radio frequency signal cycle while matching the radio frequency load impedance of the amplitude detector to the radio frequency impedance of a signal source, the signal terminating means having an output at which a demodulated signal is produced having an amplitude proportional to the amplitude of any low frequency signal present in a radio frequency signal directed to the amplitude detector.

2. The low noise floor amplitude detector of claim 1 wherein said predetermined conducting angle is substantially equal to 67 degrees and said predetermined percent is substantially equal to 37 percent of each radio frequency signal cycle.

3. The low noise floor amplitude detector of claim 1 wherein the terminating means is a passive resistive load, the demodulated signal being the voltage across the passive resistive load.

4. The low noise floor amplitude detector of claim 1 wherein the terminating means is an active resistive load, the demodulated signal being the voltage across the active resistive load.

5. The low noise floor amplitude detector of claim 1 wherein the terminating means is a current source, the demodulated signal being the voltage drop across the current source.

6. The low noise floor amplitude detector of claim 1 wherein the terminating means is a voltage source, the demodulated signal being the current flowing through the voltage source.

7. The low noise floor amplitude detector of claim 1 wherein the remaining side of each diode is adapted to be shunted to ground directly through a radio frequency signal source.

8. The low noise floor amplitude detector of claim 1 wherein the first capacitor is adapted to be interposed between the one side of the one diode and ground through a radio frequency signal source, the remaining side of the one diode being shorted to ground.

9. The low noise floor amplitude detector of claim 1 further comprising:
   a third capacitor adapted to be operatively connected between the remaining sides of the pair of diodes and ground through a radio frequency signal source.

10. The low noise floor amplitude detector of claim 1 wherein the terminating means is a fixed passive resistance having a source of constant voltage in series with it to provide turn on voltage for the diodes.

* * * * *